Nov. 14, 1961 R. L. PETRITZ 3,009,085

COOLED LOW NOISE, HIGH FREQUENCY TRANSISTOR

Filed Nov. 19, 1959

INVENTOR.
RICHARD L. PETRITZ

BY [signatures]
ATTORNEYS.

United States Patent Office 3,009,085

Patented Nov. 14, 1961

3,009,085

COOLED LOW NOISE, HIGH FREQUENCY TRANSISTOR

Richard L. Petritz, Dallas, Tex., assignor to the United States of America as represented by the Secretary of the Navy Filed Nov. 19, 1959, Ser. No. 854,211
6 Claims. (Cl. 317—235)
(Granted under Title 35, U.S. Code (1952), sec. 266)

The invention described herein may be manufactured and used by or for the Government of the United States of America for governmental purposes without the payment of any royalties thereon or therefor.

This invention relates to an electronic amplifying device capable of operation at very high frequencies up to 100,000 megacycles and more particularly to a transistor capable of operation at very high frequencies up to 100,000 megacycles and at noise temperatures of 4° K. to 100° K.

At present there are no vacuum tubes which operate at such high frequencies with such low noise temperatures. There are no other transistors at present which operate at such high frequencies. Present germanium transistors operate only to about 1000 megacycles. Vacuum tubes such as traveling wave tubes operate at microwave frequencies but at a high noise level. The traveling wave tubes are also bulky and require high power in their operation. Maser type amplifiers and parametric amplifiers may be promising approaches to low noise, high frequency amplification. However, generally, these require high frequency pumping power of quite high level. The transistor of the present invention requires only conventional D.-C. power and cooling for its operation. If present type transistors of germanium and silicon were cooled to a temperature in the region of 4° K. to 100° K. they would not perform well because of mobility reduction, carrier freeze out, and reduced lifetime.

However, as more clearly shown hereinafter, cooling transistors made of indium antimonide to a temperature in the range 4° K. to 100° K. will result in new and unexpected increase in the high frequency capability and in the low noise performance of the cooled transistor. In the case of indium arsenide the temperature range is 4° K. to 220° K.

According to this invention a cooled transistor of a high mobility material such as indium antimonide or indium arsenside is employed as a solution to the problem of low noise, very high frequency amplification.

It is an object of this invention to provide an electronic device for very high frequency, low temperature amplification with low noise level.

It is another object of this invention to provide a low noise, very high frequency transistor operable at low temperature.

Another object of this invention is to provide a very high frequency, low noise transistor employing a high mobility semiconductor material such as indium antimonide or indium arsenside.

A further object of this invention is to provide a very high frequency, low noise transistor suitable for operation at temperature from 4° K. to 100° K.

A still further object is to provide a transistor having a low noise characteristic.

Another object of this invention is to provide a transistor operable at very high frequencies up to 100,000 megacycles.

Other objects and many of the attendant advantages of this invention will be readily appreciated as the same becomes better understood by reference to the following detailed description when considered in connection with the accompanying drawing in which.

Figures 1, 4:
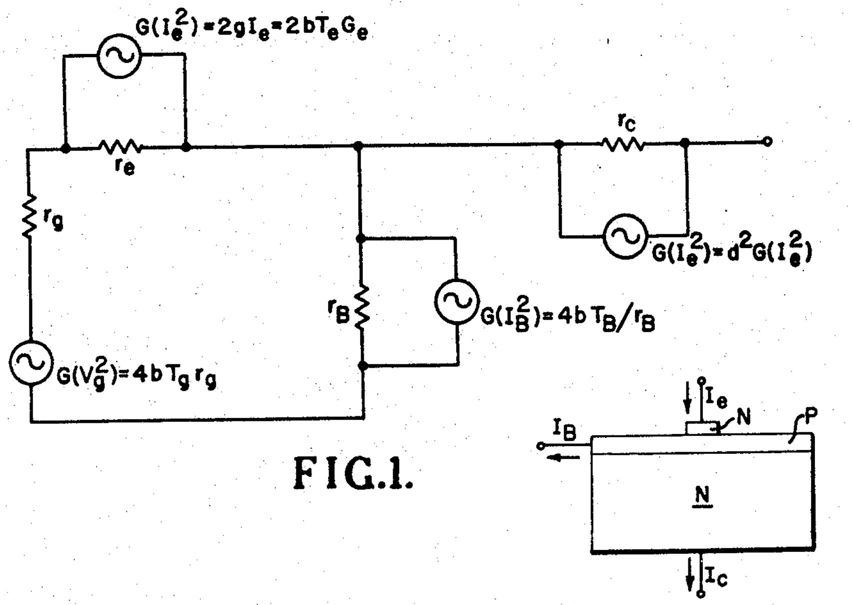
FIG. 1 illustrates an equivalent circuit for a P-N-P type transistor.
FIG. 4 is a view of another form of an N-P-N type transistor suitable for use with the present invention.

Referring now to FIG. 1, illustrating an equivalent transistor circuit of the P-N-P type, the emitter noise $$G[I_e^2]=2qI_e \qquad (1)$$

where $q$ is the charge of each charge carrier and $I_e$ is the emitter current. This equation is also expressible in terms of the temperature and conductance of the emitter. This relationship comes from $$I_e=I_s[e^{qV_e/kT_e}-1]\cong I_s e^{qV_e/kT_e}$$

for $$qV_e/kT_e \gg 1$$

$$G_e=\left|\frac{\partial I_e}{\partial V_e}\right|=\frac{q}{kT_e}I_e$$

$$G[I_e^2]=2qI_e=2kT_eG_e \qquad (2)$$

From Equation 2 it follows that cooling the emitter will reduce the noise for a given emitter conductance $G_e$. When the transmitter is connected to an antenna of matched impedance, $rg=re=1/G_e$, the noise figure can be shown to be, $$\text{n.f.}=1+\tfrac{1}{2}\frac{T_e}{T_g}$$

if the noise from the base resistance and other sources of noise such as $1/f$ noise is neglected. If the effective antenna temperature is low, e.g. $T_g=4°$ K. and the transistor is operated at room temperature, i.e. 300° K. the transistor will have a poor noise figure $$\left[\text{n.f.}=1+\tfrac{1}{2}\frac{300}{4}\right]$$

However, if the transistor is cooled to 4° K., the noise figure [n.f.$=1+\tfrac{1}{2}$] will be significantly improved.

Figure 2:
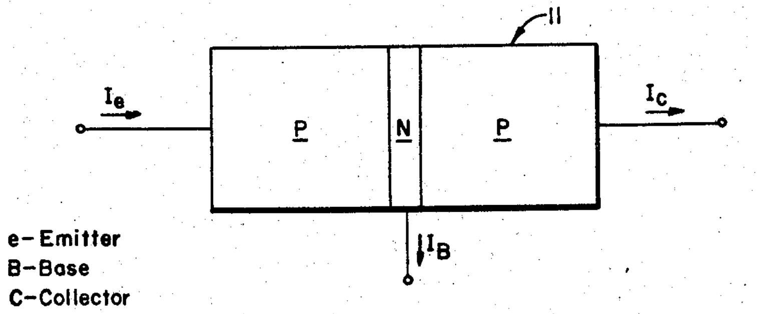
FIG. 2 illustrates a P-N-P type transistor.

Referring now to FIG. 2 of the drawing, a P-N-P type transistor having two P portions and an N portion is shown as an exemplary embodiment of the type transistor used in the present invention where $I_e$ is the emitter current, $I_B$ is the base current and $I_c$ is the collector current. Although the P-N-P type is illustrated in FIG. 2, other types of transistors such as an N-P-N Mesa type shown in FIG. 4 could be used.

The impurities used for N-type doping of the semiconductor are materials from group VI of the periodic table such as selenium and tellurium. The corresponding P-type doping materials are from group II of the periodic table such as zinc and cadmium.

Figure 3:
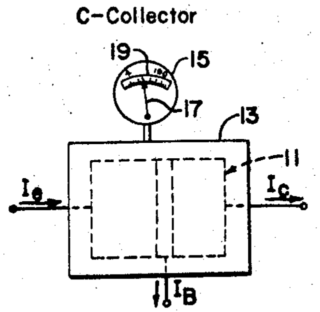
FIG. 3 illustrates a transistor located within a cooling unit.

Referring to FIG. 3 of the drawing, transistor or semiconductor body 11 is shown inside of a refrigerator or cooling unit 13. Cooling unit 13 is equipped with a temperature gauge 15 having pointer 17 and dial 19. Any type of cooling unit including Peltier cooling may be used that is capable of maintaining the transistor within a temperature range between 4° K. and 100° K.

Current flow in a semiconductor can occur by drift of the carriers in the presence of an electric field, or by diffusion resulting from a concentration gradient or by a combination of diffusion and drift. Transistors can be made in which the flow or minority carriers through the base region occurs principally by diffusion [referred to herein as Diffusion transistors], or primarily by drift [referred to herein as Drift transistors]. Examples of Drift transistors are graded base, diffused base, and point contact transistors. In the graded base and diffused base transistors, the electric field is built into the base region by a non-uniform distribution of donor [or acceptor] atoms. Low temperature operation is applicable for both the Diffusion type transistor and the Drift type transistor. Low temperature Diffusion transistors of indium antimonide and indium arsenside should be feasible and should have low noise and medium frequency characteristics. The most serious limitation of the low temperature Diffusion transistor is that its high frequency response is limited by the fact that carriers must diffuse across the base region. With decreasing temperature the transit time increases and the cut off frequency decreases.

Drift type transistors are also feasible for low temperature operation. In addition to the low noise characteristic of the Diffusion type, the Drift transistor structure should have unexpected high frequency capabilities in the 10,000 to 100,000 megacycle region. This is achieved through use of InSb when this material is cooled to the temperature range of 4° K. to 100° K.

In the case of the Drift transistor, the cooling to temperatures in the range of 4° K. to 100° K. does not decrease the frequency response in the case of the Diffusion transistor, but on the contrary, causes a substantial increase in the frequency response characteristics of the cooled Drift transistor when made from indium antimonide. For indium arenside a temperature range of 4° K. to 220° K. is satisfactory.

Applications in which cooling of transistors should be useful include long range radar and communications systems, computers and complex electronic gear in general where high frequency and low noise performance are necessary. The improved noise figures of long range radar and communications systems will provide for lower transmitter power which will result in a significant decrease in the overall size of the equipment. The extra cost of cooling such equipment will be offset by the reduction in the cost, size and power requirements of the transmitting equipment. In the case of computers, the use of cooling will provide for solving problems with much less equipment.

Obviously many modifications and variations of the present invention are possible in the light of the above teachings. It is therefore to be understood that within the scope of the appended claims, the invention may be practiced otherwise than as specifically described.

What is claimed as new and desired to be secured by Letters Patent of the United States is:

1. A low noise, very high frequency transistor having an emitter, a base and a collector, and adapted to be operated in a temperature range between 4° K. and 100° K. comprising a semiconductor body composed of indium antimonide semiconductor material, cooling means surrounding said semiconductor body for maintaining said semiconductor body within said temperature range such that a low noise figure and a high frequency cutoff of said transistor are produced.

2. A transistor having a very high frequency response and a low noise characteristic comprising a semiconductor body composed of an indium antimonide semiconductor material, and cooling means surrounding said semiconductor body for maintaining said body at an operating temperature range between 4° K. and 100° K. such that a very high frequency cutoff and a low noise figure of said transistor may be attained.

3. A low noise, very high frequency transistor adapted to be operated in a temperature range between 4° K. and 220° K. comprising a semiconductor body composed of an indium arsenide semiconductor material; cooling means surrounding said semiconductor body to maintain said semiconductor body within said temperature range such that a very high frequency cutoff and a low noise figure are produced.

4. A transistor having a very high frequency response and a low noise characteristic comprising a semiconductor body composed of indium arsenide semiconductor material, and means surrounding said semiconductor body for maintaining said body at an operating temperature range between 4° K. and 220° K. to increase the frequency cutoff and reduce the noise figure of said transistor whereby said high frequency response and said low noise characteristics are made possible.

5. A low noise, very high frequency transistor having an emitter, a base and a collector, and adapted to be operated in the temperature range between 4° K. and 220° K. comprising a semiconductor body composed of a semiconductor material selected from the class consisting of indium arsenide and indium antimonide; means surrounding said transistor for maintaining said temperature range to increase the cutoff frequency and reduce the noise figure of said transistor such that said transistor may be operated at very high frequencies and at low noise conditions.

6. A transistor having a very high frequency response and a low noise characteristic comprising a semiconductor body composed of a semiconductor material selected from the class consisting of indium arsenide and indium antimonide, and means surrounding said transistor for maintaining said semiconductor material at an operating range between 4° K. and 220° K. whereby a frequency response as high as 100,000 megacycles and a low noise figure may be attained.

References Cited in the file of this patent

UNITED STATES PATENTS

| | | |
|---|---|---|
| 2,796,563 | Ebers et al. | June 18, 1957 |
| 2,798,989 | Welker | July 9, 1957 |